Nov. 24, 1964 K. LEHOVEC 3,158,746

LIGHT MODULATION IN A SEMICONDUCTOR BODY

Filed Dec. 27, 1960

KURT LEHOVEC
*INVENTOR.*

BY Connolly and Hutz

HIS ATTORNEYS

United States Patent Office 3,158,746
Patented Nov. 24, 1964

3,158,746

LIGHT MODULATION IN A SEMICONDUCTOR BODY

Kurt Lehovec, Williamstown, Mass., assignor to Sprague Electric Company, North Adams, Mass., a corporation of Massachusetts Filed Dec. 27, 1960, Ser. No. 78,590
3 Claims. (Cl. 250—199)

This invention relates to the modulation of electromagnetic radiation by an electric signal applied to a semiconductor body. More particularly, this invention relates to the use of space-charge layers in a semiconductor body as a variable shutter which can be controlled by an electric signal applied to at least one of the space-charge layers to modulate the passage of light through the semiconductor body.

In U.S. Letters Patent 2,929,923 issued March 22, 1960 and in an article entitled "Gate Modulation of Electromagnetic Radiation" in J. Applied Physics, 26, No. 5, 495–496 (May 1955) I have disclosed the concept and structure required to utilize the space-charge region of a P-N junction in a semiconductor body as an optical window having a width which can be modulated by an applied field. It has been explained that the space-charge layer at a P-N junction is a region of low concentration of electrons and holes and therefore exhibits less absorption of radiation of light wave intensity in a certain spectral range than the bulk of the semiconductor body.

The structural embodiment of my prior disclosures has involved the projection of light upon a semiconductor body having a P-N junction, with the P-N junction being biased in a blocking direction by means of an imposed potential, and with means for varying the bias potential in an alternating fashion.

More specifically, my prior apparatus for modulating a light beam by the intensity of an electrical signal has included a semiconductor body having a generally planar P-N junction, optical means for projecting a beam of light parallel along said junction with the junction being transparent to the light and with the bulk of the semiconductor body being substantially opaque to the light, bias structure connected to electrically bias the junction in the blocking direction, modulator means connected to vary the bias in accordance with the desired modulation of the light, and receiver means to accept the light which has passed through the semiconductor body.

A shortcoming of my prior device was that the light had to penetrate along the P-N junction, which permitted the modulation of only a very narrow light beam, since the P-N junction width is quite small, typically of the order of a few tenths of a mil. In other words, a difficulty that arose from having the light impinge on the semiconductor body parallel to the P-N junction was that the width of the space-charge layer at the P-N junction could not be varied sufficiently to permit light beams of the desired width to penetrate through the semiconductor body.

It is an object of this invention to overcome the above and related disadvantages of the prior structure.

It is a further object of this invention to provide semiconductor structure capable of controlling the intensity of a light beam of substantial cross-section, in the order of several mils.

It is a still further object to provide a light modulation device capable of modulating the intensity of a large cross-sectional light beam passing through a semiconductor body by the electrical potential applied to a space-charge layer at a conductivity junction in said body.

These and other objects of this invention will become more apparent upon consideration of the following description when read in the light of the accompanying drawing wherein.

Figure 1:
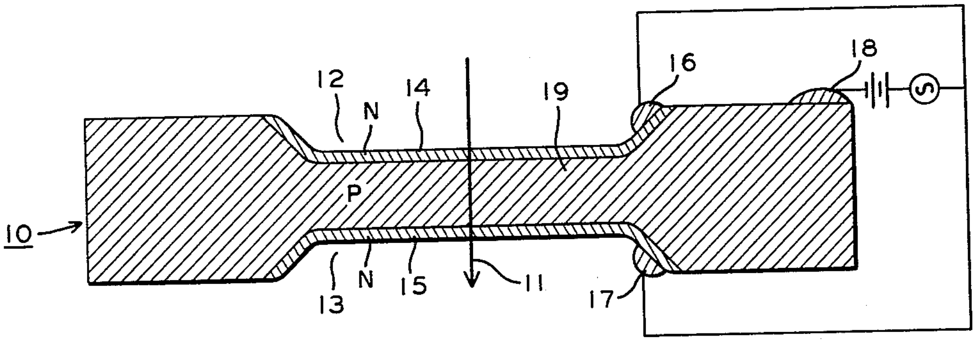
FIGURE 1 is a cross-section through a semiconductor body constructed according to this invention.

It should be noted that in accordance with accepted patent office practice the structure shown in the drawing is not drawn to scale, but the thickness of the body is exaggerated with respect to the length of the body to enhance the illustrative value of the figures.

The objects of this invention are attained by a semiconductor having one or more space-charge layers which are biased to control the penetration of light beams that are directed perpendicular to the space-charge layers. More specifically, this invention provides structural embodiments having one or more space-charge layers in a semiconducting body which, by control of the electrical potential applied at the space-charge layer or layers, can be used to modulate the intensity of a light beam of substantial cross-sectional area passing through said body.

For a detailed account of the quantitative relationships that must exist for the purposes of this invention to be attained, as set forth in the preceding paragraph, reference is made to the drawings wherein FIGURE 1 shows a semiconducting body 10. Although it should be understood that semiconducting body 10 may be of either conductivity type, for the purposes of this description body 10 will be described in terms of P-type germanium of 0.25 ohm centimeter resistivity. Indentations 12 and 13 are formed in body 10 leaving a comparatively narrow web 19, of the order of several tenths of a mil thick. Indentations 12 and 13 are preferably produced by procedures which will be described below in the illustrative specific example of this invention. Generally speaking, indentations 12 and 13 may be produced by methods that are now well-known in the electrochemical transistor art; reference is made to Proceedings IRE, 41, No. 12, 1702–1720 (December 1953).

N-type layers 14 and 15 of germanium line the surfaces of indentations 12 and 13, respectively. Thus across the narrow web of semiconducting body 10, we have a NPN configuration containing two PN junctions. Circuit contacts are made to semiconducting body 10 by means of ohmic contacts 16 and 17 on N-type linings 14 and 15, respectively, and to ohmic contact 18 to the P-type body of semiconductor 10.

To facilitate understanding of this invention, a detailed analysis of the operation of the device of FIGURE 1 will now be presented. Ohmic contacts 16 and 17 are connected by external means, and a positive potential is applied to these contacts with respect to ohmic contact 18. This positive potential is variable in magnitude, thereby modulating light transmittance along the line 11 of FIGURE 1. Light transmittance is determined by the light absorption of the P-type holes within the narrow web region 19 in germanium body 10. Light of appropriate wave lengths, e.g., two microns or longer, may be accommodated by germanium. Generally speaking, the light must be of a wave length longer than the so-called "absorption edge" of the lattice absorption of the semiconducting material. Germanium is fairly transparent for light of these wave lengths except for the absorption by the free carriers of charge, i.e., electrons and holes. For light of wave lengths of 2 to 30 microns, a hole absorbs stronger in germanium than an electron.

It is well known that a space-charge layer exists at a PN junction, and that within the space-charge layer the concentration of P-type carriers, holes, is very small. It is also well known that the space-charge layer expands with increases in applied potential of appropriate polarity. Thus, the effective width of the P-type germanium layer within the narrow web region, having P-type carriers that are not depleted, is governed by the potential applied at the PN junctions along the surfaces of the narrow web. This effective width can be modulated by the applied potential. With sufficiently high potential, the P-type carriers are removed from the entire narrow web; this condition is known as punch-through. In this case the absorption of P-type carriers in the narrow web disappears completely.

The absorption of radiation in the P-type layer sandwiched between the two N-type linings 14 and 15 can be estimated as follows. The absorption cross section of holes in P-type germanium for radiation of wave lengths between 10 and 30 microns is $C \approx 6\times10^{-16}$ cm.$^2$ (cf. Gmelin's Handbuch, Germanium Volume, Eighth Edition, p. 101). This means that radiation of these wave length penetrating through the narrow web region of the device in FIGURE 1 is attenuated by the factor exp. (−PWC) where P is the concentration of holes in the P-region, W is the width of the P-region outside the space-charge layers of the two PN junctions, and C is the capture cross section of holes. If $W=5\times10^{-4}$ cm., and $P=1.7\times10^{16}$/cm.$^3$ for P-type germanium of 0.25 ohm cm. resistivity, and $C=6\times10^{-16}$ cm.$^2$., the radiation will be attenuated by the factor exp. ($5.1\times10^{-3}$) which is 0.5%.

This attenuation would be removed by bias voltages applied at the two PN junctions of such magnitude that the two space-charge layers would extend across the entire P layer and meet at the center of the P layer. The potential that would be required for this condition to occur may be estimated by assuming that the N-type impurity concentration in the N-type linings 14 and 15 is much larger than the concentration of holes in the P-region (i.e., much larger than $1.7\times10^{16}$/cm.$^3$). Since there is a PN junction at each boundary of the P layer, we need consider only one-half of the total amount of P-type impurities. Hence, $PW/2=4.25\times10^{12}$/cm.$^2$.

These charges would generate an electric field of $$F_0=\frac{e}{\epsilon\,\epsilon_0}\,PW/2$$

wherein $e$ is the electron charge, $\epsilon$ is the dielectric constant of germanium, and $\epsilon_0$ is equal to $8.86\times10^{-14}$ amp sec./volt cm. A very workable estimate of $e/\epsilon\epsilon_0$ is $10^{-7}$ volt cm. Therefore, computing the field generated across the PN junction by removing all holes from one-half the P layer, one finds a field of $4.25\times10^5$ volt/cm. which is just slightly larger than the Zener breakdown voltage of germanium ($2.5\times10^5$ volts/cm.). The corresponding voltage across the PN junction would then be $$V_0=F_0W/4=53 \text{ volts}$$

These calculations show that the application of approximately 30 volts to each of the PN junctions in the blocking direction removes most of the holes from the P-type layer between the junctions. Removal of most of the holes effects an attenuation of several tenths of a percents of radiation of 10 to 30 micron wave lengths passing through the thin web regions in a direction substantially perpendicular to the thin web.

Various modifications and embodiments of this invention may be practiced to obtain an attenuation of the order of 50% or more. Improved attenuation can be achieved by utilizing different semiconducting materials having more favorable capture cross section for carriers of radiation. Another means for obtaining an increased capture cross section of holes for the radiation is to change the temperature of operation of the device. For example, Figure 21 on page 105 of Gmelin shows that by cooling P-type germanium from room temperature down to 77° Kelvin, the capture cross section can be doubled for radiation of the wave length of 20 microns.

Figures 2, 3:
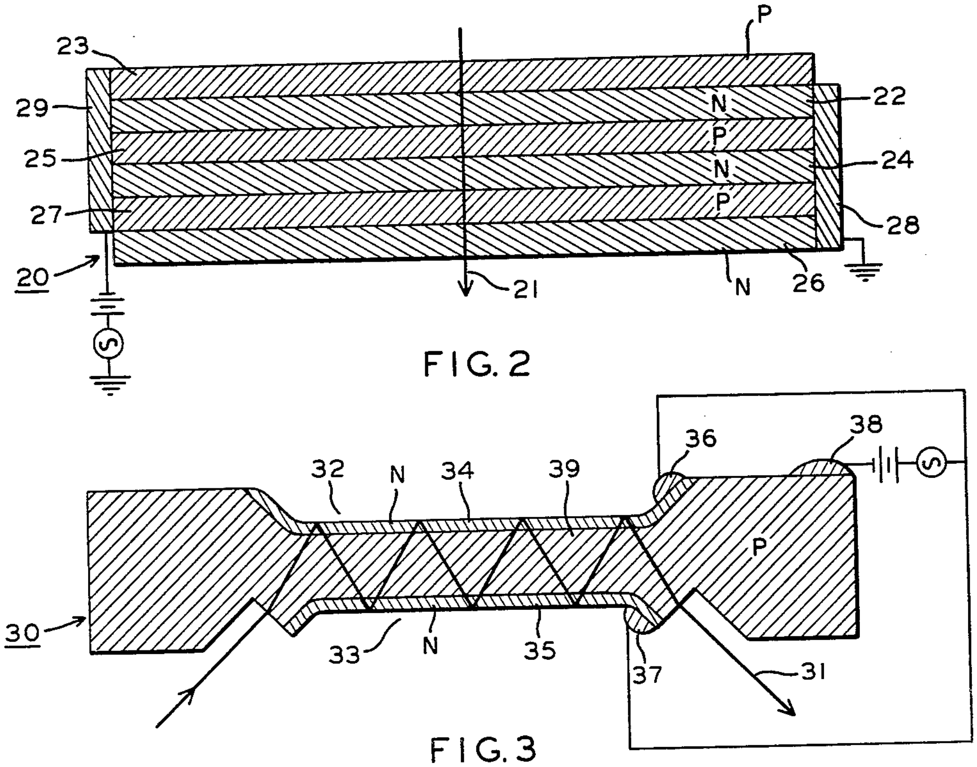
FIGURE 2 is a cross-section through another embodiment of a semiconductor body constructed according to this invention.
FIGURE 3 is a cross-section through an embodiment utilizing a modification of the arrangement shown in FIGURE 1.

FIGURE 2 is a graphic representation of another embodiment of this invention which achieves a high order of attenuation. Device 20 contains a plurality of substantially parallel PN junctions in series. These junctions are produced between P-type layers 23, 25, 27, and N-type layers 22, 24, 26. Contact 29 is ohmic to the P-type layers, and rectifying to the N-type layers; whereas contact 28 is ohmic to the N-type layers, and rectifying to the P-type layers. The substantially perpendicular direction of the radiation penetrating the system of P and N regions is shown by the arrow 21. The mathematical analysis set forth above with respect to FIGURE 1 applies when the P and N regions of FIGURE 2 are of relatively the same width as the P region of the web in FIGURE 1.

Another embodiment of this invention whereby a larger attenuation factor may be obtained is shown in FIGURE 3 wherein the optical path of a light beam through the P-type web region is increased by reflection. The structure shown in FIGURE 3 is a modification of the structure shown in FIGURE 1, and counterparts of the FIGURE 1 structure are identified by respective numerals in the 30 series.

In FIGURE 3, the light beam 31 enters the narrow web region at a graded angle sufficient to cause multiple total reflections. Thus, the narrow web region 39 of P-type conducitivity between the two PN junctions adjacent N-type linings 34 and 35 is traversed by the light beam in a multiple reflection path, e.g., six times as illustrated. Because of the high index of refraction of germanium, an angle of deviation of only a few degrees from the normal incident will cause total reflection of a light beam reaching the surface of the germanium from the interior.

The optical path of the light beam can be increased by total reflections by at least a factor equal to the ratio of the diameter of the junction to the width of the narrow web region. That is, having a 20 mil web diameter and a ½ mil web thickness will produce a factor of 40. It is not inconceivable to make this factor equal to 400 or higher by using an appropriate angle of incident for the radiation with respect to the surface of the narrow web. These large factors may be obtained by proper shaping of the surfaces where the light beam enters and leaves the germanium. Reference is made to the optical art of refraction of light beams for conventional systems for ensuring the multiple reflection of light beams within a body.

A specific structural embodiment of this invention may be constructed from a P-type single crystal germanium wafer of 0.25 ohm centimeter resistivity. The germanium wafer is oriented in the (111) crystallographic direction and is lapped to a thickness of 4 mils. Jet etching procedures are used to prepare a narrow web section of the wafer to a width in the order of 1 mil. Lead-antimony dots of approximately 20 mils diameter are then alloyed to the two opposing surfaces of the narrow web at elevated temperatures, e.g., 500° C. The lead-antimony alloy will dissolve the germanium up to a [111] crystallographic plane. By controlling the time of alloying, the web of P-type germanium is reduced to a width of $5\times10^{-4}$ cm.

Upon cooling, a thin layer of germanium is recrystallized from the lead-antimony-germanium melt which is N-type because of the presence of antimony. A concentration of 5% antimony in the lead-antimony alloy is sufficient to achieve the appropriate doping of the recrystallized germanium. The lead-antimony alloy remaining on the surfaces is then dissolved in hydrofluoric acid to leave the lined thin web structure described in FIGURE 1. The ohmic contacts to the two N-type linings are made by two small lead-antimony alloy dots approximately 5 mils in diameter alloyed to the N-type regions in a procedure well known to the art. The ohmic contact to the P-type body is made by alloying an indium dot at approximately 200° C.

It should be understood that the receiver and associated optical equipment described in my prior patent are usable with this invention for the utilitarian purposes recited in that patent, particularly the transmission of intelligence.

Obviously, many modifications and variations of the structures and the processes for producing those structures are possible in the light of the teachings of this invention. It is therefore to be understood that within the scope of the appended claims the invention may be practiced otherwise than as specifically described.

What is claimed is:

1. Apparatus for modulating the intensity of a light beam by an electric signal, said apparatus comprising a semiconducting body having at least two PN junctions, means for projecting a light beam substantially perpendicular to said PN junctions, a space-charge layer at each PN junction capable of transmitting said light, a region in said semiconducting body adjacent said space-charge layer which is less transmissive of light than said space-charge layer, said PN junctions biased in the blocking direction by an applied electric signal, means to vary the magnitude of said blocking bias whereby the width of the space-charge layer is varied to effectively alter the width of the less transmissive region, thereby causing a modulation in the intensity of the light passing essentially perpendicular to said PN junctions.

2. Apparatus for modulating the intensity of a light beam by an electric signal, said apparatus comprising a semiconducting body having a plurality of substantially parallel PN junctions, means for projecting a light beam substantially perpendicular to said PN junctions, space-charge layers at said PN junctions capable of transmitting said light, regions in said semiconducting body between each pair of said space-charge layers which are less transmissive of light than said space-charge layers, said PN junctions biased in the blocking direction by an applied electric signal, means to vary the magnitude of said signal to vary the width of said space-charge layers so as to effectively alter the width of the less transmissive regions, thereby causing a modulation in the intensity of the light passing through said body substantially perpendicular to said PN junctions.

3. Apparatus for modulating the intensity of a light beam by an electric signal, said apparatus comprising a semiconducting body having at least two PN junctions, a space-charge layer associated with said junctions which transmits light projected thereon better than the semiconducting region adjacent to said junctions, means for projecting a light beam on said semiconducting body whereby the light beam is totally reflected several times in traversing said body and alternately travels through portions of said PN junctions and portions of the adjacent semiconducting region, said PN junctions biased in the blocking direction by an applied electric signal, means to vary the magnitude of said signal whereby the width of said space-charge layer is varied to effectively alter the width of the absorptive region adjacent to said space-charge layer, thereby attenuating said light beam traversing said body.

References Cited in the file of this patent

UNITED STATES PATENTS

| | | |
|---|---|---|
| 2,692,950 | Wallace | Oct. 26, 1954 |
| 2,692,952 | Briggs | Oct 26, 1954 |
| 2,914,665 | Linder | Nov. 24, 1959 |